United States Patent [19]
Fuller

[11] Patent Number: 5,877,041
[45] Date of Patent: Mar. 2, 1999

[54] SELF-ALIGNED POWER FIELD EFFECT TRANSISTOR IN SILICON CARBIDE

[75] Inventor: Robert T. Fuller, Sandston, Va.

[73] Assignee: Harris Corporation, Melbourne, Fla.

[21] Appl. No.: 884,726

[22] Filed: Jun. 30, 1997

[51] Int. Cl.$^6$ .......................... H01L 21/00; H01L 21/336
[52] U.S. Cl. .......................... 438/105; 438/268; 438/305; 438/590; 438/931
[58] Field of Search .................... 438/105, 590, 438/595, 299, 301, 305, 306, 268, 585, 931; 148/DIG. 148

[56] References Cited

U.S. PATENT DOCUMENTS

| | | | |
|---|---|---|---|
| 5,170,231 | 12/1992 | Fujii et al. | 257/77 |
| 5,322,802 | 6/1994 | Baliga et al. | 438/268 |
| 5,393,999 | 2/1995 | Malhi | 257/289 |
| 5,395,780 | 3/1995 | Hwang | 438/305 |
| 5,543,637 | 8/1996 | Baliga | 257/607 |
| 5,597,744 | 1/1997 | Kamiyama et al. | 438/931 |
| 5,629,531 | 5/1997 | Palmour | 257/77 |

*Primary Examiner*—Michael Trinh
*Attorney, Agent, or Firm*—Jaeckle Fleischmann & Mugel, LLP

[57] ABSTRACT

The present invention is directed to a silicon carbide field effect transistor. The FET is formed on a silicon carbide monocrystalline substrate. An insulative material gate having a pair of spaced apart sidewalls is patterned on the substrate. The insulative material comprises a first insulation material overlayed by an electrically conductive layer. Within the substrate is lightly doped base regions located partially under the sidewalls of the gate and extending into the exposed substrate. Associated with the lightly doped base regions are heavily doped source regions aligned with the exposed substrate. On the underside of the substrate is a drain region to form the FET. Further in accordance with the present invention, a method to fabricate a field effect transistor is disclosed. The transistor is formed in a monocrystalline substrate of silicon carbide. Forming a transistor on the silicon carbide substrate entails depositing a first electrically insulative layer over the substrate. Next, an electrically conductive layer is deposited over the first insulative layer and then a second electrically insulative layer is deposited over the conductive layer. The following step includes partially removing the second insulative layer and exposing a portion of the first conductive layer to obtain two spaced apart regions of the silicon carbide substrate for forming lightly doped base regions. Then the substrate aligned with the exposed portion of the first conductive layer is lightly implanted with a dopant to form lightly doped base regions. Next, a layer of a third insulative material is formed on the sidewalls of the second insulative material. The following step entails removing the exposed conductive layer not aligned with the second insulative material and third insulative material. Thereby, exposing portions of the first insulating layer and defining a second set of spaced regions of the substrate. The second set of spaced regions are then heavily implanted to form heavily doped source regions. The second insulative material and third insulative material are then removed to form a gate.

10 Claims, 2 Drawing Sheets

SELF-ALIGNED POWER FIELD EFFECT TRANSISTOR IN SILICON CARBIDE

FIELD OF THE INVENTION

The present invention relates to a field effect transistor ("FET") device and, more particularly, to an improved FET and process for forming same.

BACKGROUND OF THE INVENTION

Silicon carbide as a substrate is an excellent material for power devices due to its wideband gap and high blocking voltage. However, dopants do not readily diffuse in silicon carbide substrate. Typically, dopants have been implanted into a silicon carbide substrate to form lightly doped base regions and heavily doped source regions by using two separate masks.

An example of this typical technique is disclosed in U.S. Pat. No. 5,338,945 (the "'945 Patent"). In the summary of the invention, the '945 Patent discloses "the base region of the silicon carbide field effect transistor is formed by amorphizing a first portion of a silicon carbide substrate, providing an implant of the base region dopant ions into the first portion and then recrystallizing the first portion to thereby create a substantially monocrystalline base region." The '945 Patent further discloses "Next, the source region is formed by amorphizing a second portion of the substantially monocrystalline base region, providing an implant of the source region dopant ions and then recrystallizing the second portion to thereby create a substantially monocrystalline source region in the base region." In other words, implanting dopants into a silicon carbide substrate has required at least two separate masks. The two mask technique is costly because two masks are used instead of one. More importantly, the two mask technique is difficult to use because the two masks must be properly aligned.

SUMMARY OF THE INVENTION

The present invention is directed to a silicon carbide field effect transistor. The FET is formed on a silicon carbide monocrystalline substrate. An insulative material gate having a pair of spaced apart sidewalls is patterned on the substrate. The insulative material comprises a first insulation material overlayed by an electrically conductive layer. Within the substrate is lightly doped base regions located partially under the sidewalls of the gate and extending into the exposed substrate. Associated with the lightly doped base regions are heavily doped source regions aligned with the exposed substrate. On the underside of the substrate is a drain region to form the FET.

Further in accordance with the present invention, a method to fabricate a field effect transistor is disclosed. The transistor is formed in a monocrystalline substrate of silicon carbide. Forming a transistor on the silicon carbide substrate entails depositing a first electrically insulative layer over the substrate. Next, an electrically conductive layer is deposited over the first insulative layer and then a second electrically insulative layer is deposited over the conductive layer. The following step includes partially removing the second insulative layer and exposing a portion of the first conductive layer to obtain two spaced apart regions of the silicon carbide substrate for forming lightly doped base regions. Then the substrate aligned with the exposed portion of the first conductive layer is lightly implanted with a dopant to form lightly doped base regions. Next, a layer of a third insulative material is formed on the sidewalls of the second insulative material. The following step entails removing the exposed conductive layer not aligned with the second insulative material and third insulative material. Thereby, exposing portions of the first insulating layer and defining a second set of spaced regions of the substrate. The second set of spaced regions are then heavily implanted to form heavily doped source regions. The second insulative material and third insulative material are then removed to form a gate.

DETAILED DESCRIPTION OF THE INVENTION

The previous described steps for fabricating a FET are diminished in the present invention. In this invention, a self-aligned implanted power FET, preferably a MOSFET, in silicon carbide is fabricated with a single mask. Thereby, the cost for masks are decreased and alignment problems are diminished in relation to the two step technique.

Figure 1:
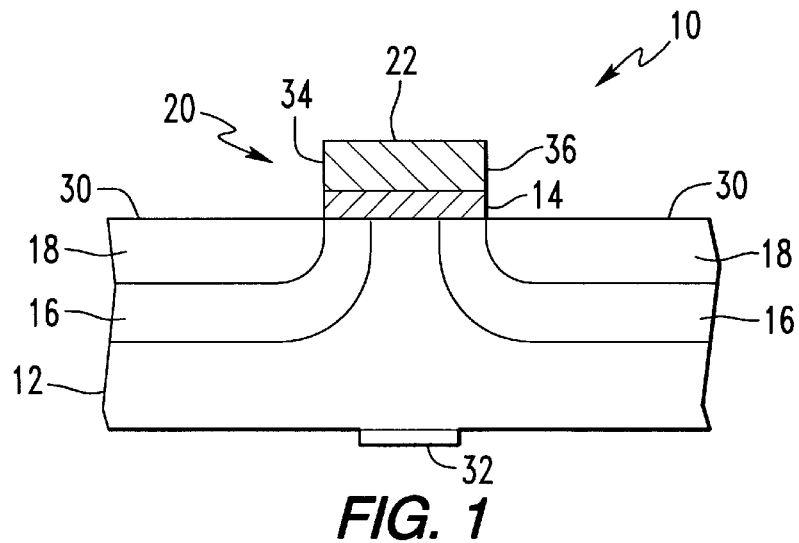
FIG. 1 is a schematic representation of a transistor of the present invention.

The present invention, as illustrated in FIG. 1, is directed to a power FET device 10 formed in a monocrystalline silicon carbide substrate 12. An insulative material gate 20 having a pair of spaced apart sidewalls 34, 36 is patterned on substrate 12. Gate 20 comprises a first insulative material 14 overlayed with an electrically conductive layer 22. Within substrate 12 is lightly doped base regions 16 located partially under sidewalls 34, 36 and extending into exposed substrate region 30. Associated with the lightly doped base regions 16 are heavily doped source regions 18 aligned with the exposed substrate 30. On the underside of substrate 12 is a drain contact 32 to form the FET 10.

The present invention illustrated in FIG. 1 is attained through a method illustrated in FIG. 2. Turning to FIG. 2a, a layer of first insulative material 14 is applied over a monocrystalline substrate 12. In particular, substrate 12 is a starting wafer composed for example of monocrystalline silicon carbide. First insulation material 14, preferably an oxide layer, is formed on the upper surface 38 of wafer 12. Oxide layer 14 is formed by low temperature chemical vapor deposition techniques, epitaxially, or rapid thermal oxidation processes that form an insulative material ranging from 250 to 350 angstroms. These processes ensure first insulative material 14 is adequately attached on substrate 12 for further deposition of elements.

Figure 2A:
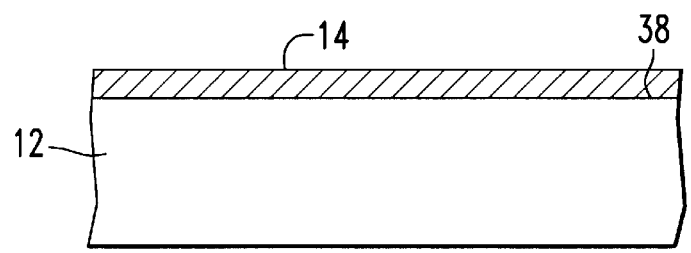
FIGS. 2a–g are a schematic depicting a process of the present invention.
Figure 2B:
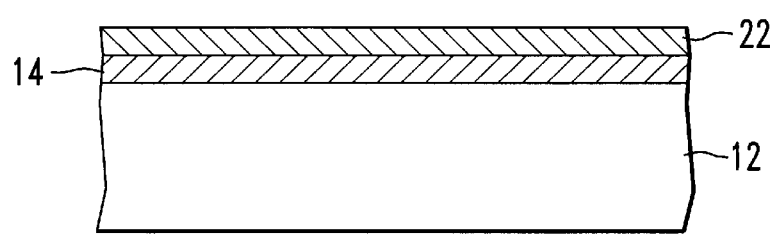

After the initial step of applying insulative material 14 over substrate 12, a layer of electrically conductive material 22, as illustrated in FIG. 2b, is applied on insulative material 14. Conductive material 22 ranges from 4,500 to 5,500 angstroms thick and can be applied by a low-pressure chemical vapor deposition (LPCVD) process. In this embodiment of the present invention conductive material 22 is polysilicon.

Figure 2C:
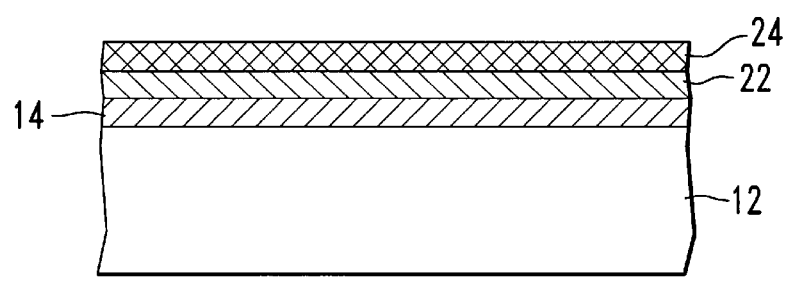

The next step, shown in FIG. 2c, entails depositing a layer of a second insulative material 24 on conductive material 22. Second insulative material 24, preferably an oxide layer, is deposited by the same techniques as first insulation material 14. Moreover, second insulation material 24, preferably, is thinner than the desired thickness of substrate 12.

Figure 2D:
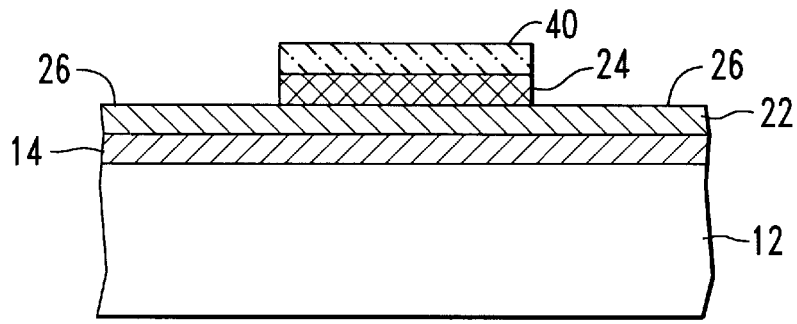

Turning to FIG. 2d, an etch resistant mask 40 is patterned on second insulative material 24. Portions of second insulative material 24 not aligned with mask 40 are removed by conventional etching techniques, such as reactive ion etching, to expose first portion 26 of conductive material 22.

Figure 2E:
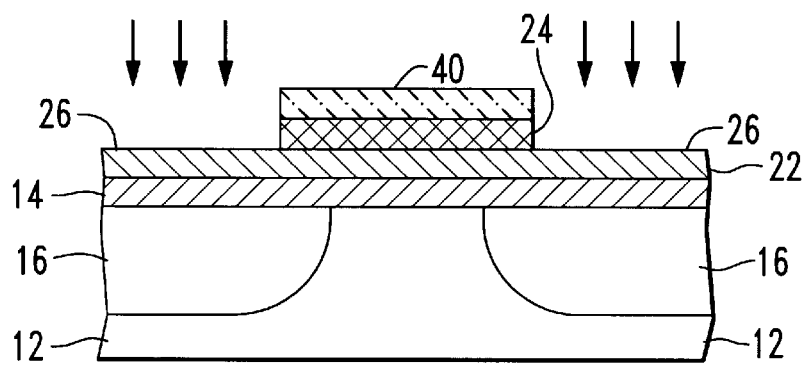

As shown in FIG. 2e, a first dopant of one polarity is implanted in substrate 12 aligned with first portion 26. The first dopant is a high implant energy source used to penetrate conductive material 22, first insulative material 14 and substrate 12. Conventionally, the implant is a dose of 2e12, energy of 360 KeV of boron and forms a lightly doped base regions 16, commonly a p-well. Second insulative material 24 and mask 40 block the boron ions from penetrating into substrate 12 aligned with material 24 and mask 40.

Figure 2F:
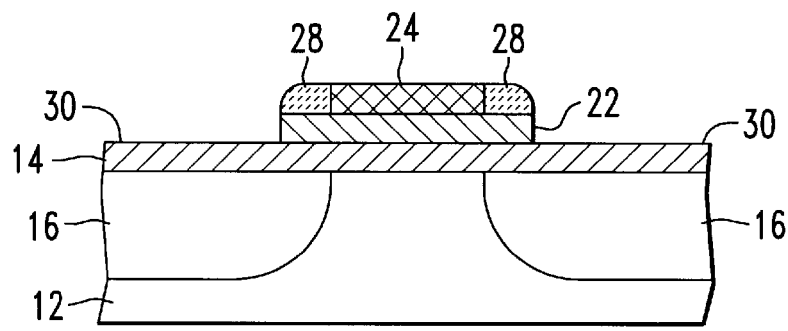

After the implantation substrate 12, mask 40 is removed exposing the remaining second insulation material 24. As illustrated in FIG. 2f, a third insulative material 28 is formed on the sidewalls of second insulative material 24. Portions of conductive material 22 not aligned with second insulative material 24 and third insulative material 28, preferably a nitride material, is removed. Conductive material 22 is removed by conventional etching techniques disclosed above. Thereby, exposing area 30 of the first insulative material 14 that is smaller than first portion 26.

Figure 2G:
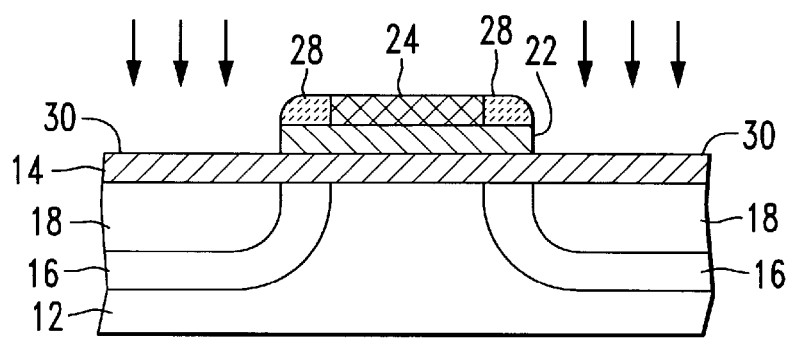

Turning to FIG. 2g, a second dopant of opposite polarity to the first dopant is then implanted in substrate 12 aligned with area 30. The second dopant normally forms a heavily doped source regions 18, commonly a n-well, with arsenic ions. Heavily doped source regions 18 are located within associated lightly doped base regions 16. Second insulative material 24 and third insulative material 28 blocks the arsenic ions from entering the underlying substrate 12.

Turning to FIG. 1, remaining second insulative material 24 and third insulative material 28 are removed. This removal process, preferably, occurs by known stripping procedures known in the semiconductor industry. Thereby, remaining conductive material 22 and first insulation material 14 aligned with conductive material 22 is gate 20. In an alternative embodiment, first insulation material 14 not aligned with conductive material 22 can be removed as well by conventional semiconductor processes.

Underside of substrate 12 is subsequently planarized to a desired thickness. Once the underside of substrate 12 is planarized, a drain contact 32 is applied to the underside. In one embodiment of drain contact 32, underside of substrate 12 is metalized.

The invention has been described in detail for the purpose of illustration, but it is understood that such detail is solely for that purpose, and variations can be made therein by those skilled in the art without departing from the spirit and scope of the invention, which is defined by the following claims.

We claim:

1. A method to fabricate a field effect transistor in a monocrystalline substrate of silicon carbide, comprising the steps of:

forming a first electrically insulative layer over the surface of the silicon carbide substrate;

depositing an electrically conductive layer over the surface of said first insulative layer;

depositing a second electrically insulative layer over the surface of said conductive layer;

partially removing said second insulative layer and exposing a portion of said conductive layer to obtain two spaced apart regions of the silicon carbide substrate for forming lightly doped base regions;

lightly implanting the substrate through the exposed conductive layer with a dopant to form lightly doped base regions in the substrate;

forming a third insulative material on the sidewalls of said second insulative material and removing said exposed conductive layer not layered with said second or third insulative material to expose portions of the first insulative layer and to define a second set of spaced regions of the silicon carbide substrate;

heavily implanting the substrate through the exposed portions of the first insulative layer to form heavily doped source regions in the substrate; and removing said second and third insulative material to form a gate.

2. The method according to claim 1 further comprising the step of planarizing the underside surface of the substrate to a desired thickness.

3. The method according to claim 2 wherein the depositing of said second insulative material is thinner than the desired substrate thickness.

4. The method according to claim 1 wherein the depositing of said third insulative material is a nitride material.

5. The method according to claim 1 wherein the depositing of said second insulative material is an oxide material.

6. The method according to claim 1 wherein the growing of said first insulative material is an oxide material.

7. The method according to claim 1 wherein the deposition of said conductive material is a polysilicon material.

8. The method according to claim 1 further comprising the steps of: forming a drain region in the underside surface of the substrate; and applying a drain contact to said underside surface.

9. The method according to claim 8 further comprising the steps of: planarizing the underside surface of said silicon carbide layer to a desired thickness and metalizing said underside surface.

10. The method according to claim 1 wherein each heavily doped source is entirely within its associated lightly doped base.

* * * * *